US011848652B2

(12) United States Patent
Baveja et al.

(10) Patent No.: US 11,848,652 B2
(45) Date of Patent: *Dec. 19, 2023

(54) AMPLIFIER CIRCUITRY

(71) Applicant: Cirrus Logic International Semiconductor Ltd., Edinburgh (GB)

(72) Inventors: Sameer Baveja, Edinburgh (GB); Hamed Sadati, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/741,149

(22) Filed: May 10, 2022

(65) Prior Publication Data
US 2022/0271721 A1    Aug. 25, 2022

Related U.S. Application Data

(63) Continuation of application No. 17/028,059, filed on Sep. 22, 2020, now Pat. No. 11,368,134.

(60) Provisional application No. 62/911,586, filed on Oct. 7, 2019.

(30) Foreign Application Priority Data

Nov. 1, 2019  (GB) ..................... 1915936

(51) Int. Cl.
  *H03F 3/45* (2006.01)
  *H03F 1/26* (2006.01)
  *H03F 1/52* (2006.01)
(52) U.S. Cl.
  CPC .......... *H03F 3/45479* (2013.01); *H03F 1/26* (2013.01); *H03F 1/52* (2013.01); *H03F 2200/03* (2013.01);
  (Continued)

(58) Field of Classification Search
  CPC .......... H03F 3/45479; H03F 1/26; H03F 1/52; H03F 2200/03; H03F 2200/153;
  (Continued)

(56) References Cited

U.S. PATENT DOCUMENTS 4,079,199 A   3/1978  Patronis, Jr.
6,509,792 B2  1/2003  Engl
(Continued)

FOREIGN PATENT DOCUMENTS

EP         2834994 A1    2/2015

OTHER PUBLICATIONS

International Search Report and Written Opinion of the International Searching Authority, International Application No. PCT/GB2020/052242, dated Dec. 15, 2020.
(Continued)

*Primary Examiner* — Hieu P Nguyen
(74) *Attorney, Agent, or Firm* — Jackson Walker L.L.P (57) ABSTRACT

This application relates to circuitry for monitoring for instability of an amplifier. The amplifier (100) has a first signal path between an amplifier input ($IN_N$) and an amplifier output ($V_{OUT}$) and a feedback path from the output to form a feedback loop with at least part of the first signal path. A comparator (212) has a first input configured to receive a first signal ($IN_N$) derived from a first amplifier node which is part of said feedback loop and a second input configured to receive a second signal ($IN_P$) derived from a second amplifier node which varies with the signal at the amplifier input but does not form part of said feedback loop. The comparator is configured to compare the first signal to the second signal and generate a comparison signal (COMP), wherein in the event of amplifier instability the comparison signal comprises a characteristic indicative of amplifier instability.

14 Claims, 5 Drawing Sheets

(52) U.S. Cl.
    CPC .... *H03F 2200/153* (2013.01); *H03F 2200/78* (2013.01)

(58) Field of Classification Search
    CPC ...... H03F 2200/78; H03F 1/083; H03F 3/187; H03F 3/45475; H03F 3/45928; H03F 2200/228; H03F 2200/297; H03F 2203/45528; H03F 1/34; H03F 3/183; H04R 5/04; H04R 2420/05; H04R 3/00
    USPC .................................................. 330/252–261
    See application file for complete search history.

(56) References Cited

U.S. PATENT DOCUMENTS

| | | | |
|---|---|---|---|
| 7,535,305 B1 | 5/2009 | Li et al. | |
| 8,229,372 B2* | 7/2012 | Hoyerby | H03F 3/24 330/129 |
| 10,244,306 B1 | 3/2019 | Ku et al. | |
| 10,333,473 B1* | 6/2019 | Shen | H03F 1/0205 |
| 10,778,160 B2* | 9/2020 | Butler | H03F 3/2173 |
| 2001/0054930 A1 | 12/2001 | Engl | |
| 2012/0019317 A1 | 1/2012 | Giotta et al. | |
| 2022/0271722 A1 | 8/2022 | Baveja et al. | |

OTHER PUBLICATIONS

Combined Search and Examination Report under Sections 17 and 18(3), UKIPO, Application No. GB1915936.7, dated Apr. 30, 2020.
Examination Report under Sections 17 and 18(3), UKIPO, Application No. GB1915936.7, dated Aug. 9, 2021.

* cited by examiner

AMPLIFIER CIRCUITRY

The present disclosure is a continuation of U.S. Non-Provisional patent application Ser. No. 17/028,059, filed Sep. 22, 2020, which claims priority to U.S. Provisional Patent Application Ser. No. 62/911,586, filed Oct. 7, 2019, and United Kingdom Patent Application No. 1915936.7, filed Nov. 1, 2019, each of which is incorporated by reference herein in its entirety.

FIELD OF DISCLOSURE

The field of representative embodiments of this disclosure relates to methods, apparatus and/or implementations concerning or relating to amplifier circuitry, and in particular to apparatus and methods for monitoring for and detecting amplifier instability.

BACKGROUND

Many electronic devices have the ability to provide audio driving signals to audio output transducers, e.g. loudspeakers. In some cases the electronic device may be capable of providing audio driving signals to an accessory or peripheral apparatus, for example a set of headphones or earbuds or the like, that may, in use, be removably connected to the electronic device via some wired connection. For example, many electronic devices may have a receptacle or socket, such as a 3.5 mm jack-socket for example, for receiving a corresponding mating plug of an accessory apparatus. Audio driving circuitry, for example an audio codec, of the electronic device may be operable to provide analogue audio driving signals to drive loudspeakers of the accessory apparatus when connected.

There is a wide variety of different audio accessory apparatus that may, in use, be connected to such an electronic device and at least some audio accessory apparatus may represent a relatively high impedance load. For example, some headphone accessories may have a load impedance, for DC, of the order of several hundred ohms. Given the variety of accessories, and various ways in which an accessory can be connected, in some instances the connected load may have significant unwanted capacitance and/or inductance.

For performance reasons, e.g. to provide good power supply rejection ratio (PSRR) and total harmonic distortion (THD) qualities, such audio driving circuitry, e.g. headphone amplifiers, are typically arranged with a relatively high open loop gain and high bandwidth. Such amplifiers are designed to be stable for expected load conditions. However, under some operating conditions an amplifier can become unstable.

Amplifier instability can result in a variety of negative impacts, such as audible noise during periods of silence or even during playback. Amplifier instability can also lead to the amplifier drawing a relatively large amount of current. This can be particularly undesirable in the case of portable devices, which draw power from a finite power source, such as a battery.

SUMMARY

Embodiments of the present disclosure relate to methods, apparatus and systems for monitoring for and detecting amplifier instability.

According to an aspect of the disclosure there is provided circuitry for monitoring for amplifier instability, comprising: an amplifier, comprising:
a first signal path between an amplifier input and an amplifier output; and
a feedback path from the amplifier output to form a feedback loop with at least part of the first signal path; and
a comparator, comprising: a first input configured to receive a first signal derived from a first amplifier node which is part of said feedback loop; and
a second input configured to receive a second signal derived from a second amplifier node which varies with the signal at the amplifier input but does not form part of said feedback loop;
wherein the comparator is configured to compare the first signal to the second signal and generate a comparison signal and wherein in the event of amplifier instability the comparison signal comprises a characteristic indicative of amplifier instability.

The characteristic indicative of amplifier instability may comprise a characteristic frequency. The circuitry may further comprise a processing module configured to receive the comparison signal and to process the comparison signal to detect the characteristic frequency.

In some examples the characteristic frequency may comprise a frequency within a defined frequency range. The defined frequency range may include a frequency corresponding to a unity gain bandwidth of the amplifier.

In some implementations the characteristic frequency may comprise a frequency that exceeds a defined threshold. The defined threshold may, in some instances, be based on a value of maximum input signal frequency and a scaling factor. The processing module may be configured so that at least one of the value of maximum input signal frequency and the scaling factor are configurable.

In some examples the processing module may comprise a counter configured to receive a clock signal, and the processing module may be configured to determine a cycle period of the comparison signal as a value indicative of the frequency of the comparison signal. In some example the processing module may comprise a counter configured to receive a clock signal, and the processing module may be configured to determine a count value of a number of cycles of the comparison signal in a count period defined by the clock signal.

The processing module may be configured to determine that comparison signal comprises the characteristic indicative of amplifier instability if the characteristic frequency persists for a predetermined time period. The predetermined time period may be configurable.

The circuitry may further comprise a controller, wherein in response to the processing module detecting the characteristic indicative of amplifier instability, the processing module may be configured to output a detection signal to the controller. In response to receiving the detection signal, the controller may be configured to output a control signal. The control signal may control the amplifier to shut-down or to adjust at least one parameter of operation of the amplifier.

In some implementations the first amplifier node comprises a first differential input of the amplifier and the second amplifier node comprises a second differential input of the amplifier.

In some examples the amplifier comprises an input gain stage and also one or more subsequent gain stages, and the first amplifier node comprises an input to one of the subsequent gain stages and the second signal path comprises a reference for that subsequent gain stage.

The circuitry may be implemented as an integrated circuit.

The circuitry may form at least part of an audio codec.

An aspect also relates to an electronic device comprising circuitry as described in any of the variants herein. The electronic device may also include a connector for making a removable mating connection with an accessory apparatus in use, wherein said circuitry is configured to output at least one audio driving signal to an electrical contact of said connector. The electronic device may be at least one of: a portable device, a battery powered device, a communication device; a mobile or cellular telephone device or a smartphone; a computing device; a tablet, notebook, laptop or desktop computer; a wearable device; a smartwatch; a voice activated or voice controlled device.

In another aspect there is provided circuitry for detecting amplifier instability, comprising: an amplifier; and a processing module configured to receive a first signal from the amplifier and to process the first signal to detect a characteristic frequency indicative of an instability of the amplifier.

In another aspect there is provided circuitry for detecting instability of an amplifier, comprising:

a first input configured to receive a first input signal derived from the amplifier;

a second input configured to receive a second input signal derived from the amplifier; and a comparison module configured to compare the first input signal to the second input signal and detect a characteristic indicative of instability of the amplifier based on the comparison.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As discussed above, a host device may include audio driver circuitry, such as an audio codec or the like, for outputting audio driving signals to audio transducers. The audio driver circuit may be capable of outputting audio drive signals to an accessory apparatus that, in use, is removably connected to the host device, and the audio driver circuitry may thus comprise a headphone amplifier circuit.

Figure 1:
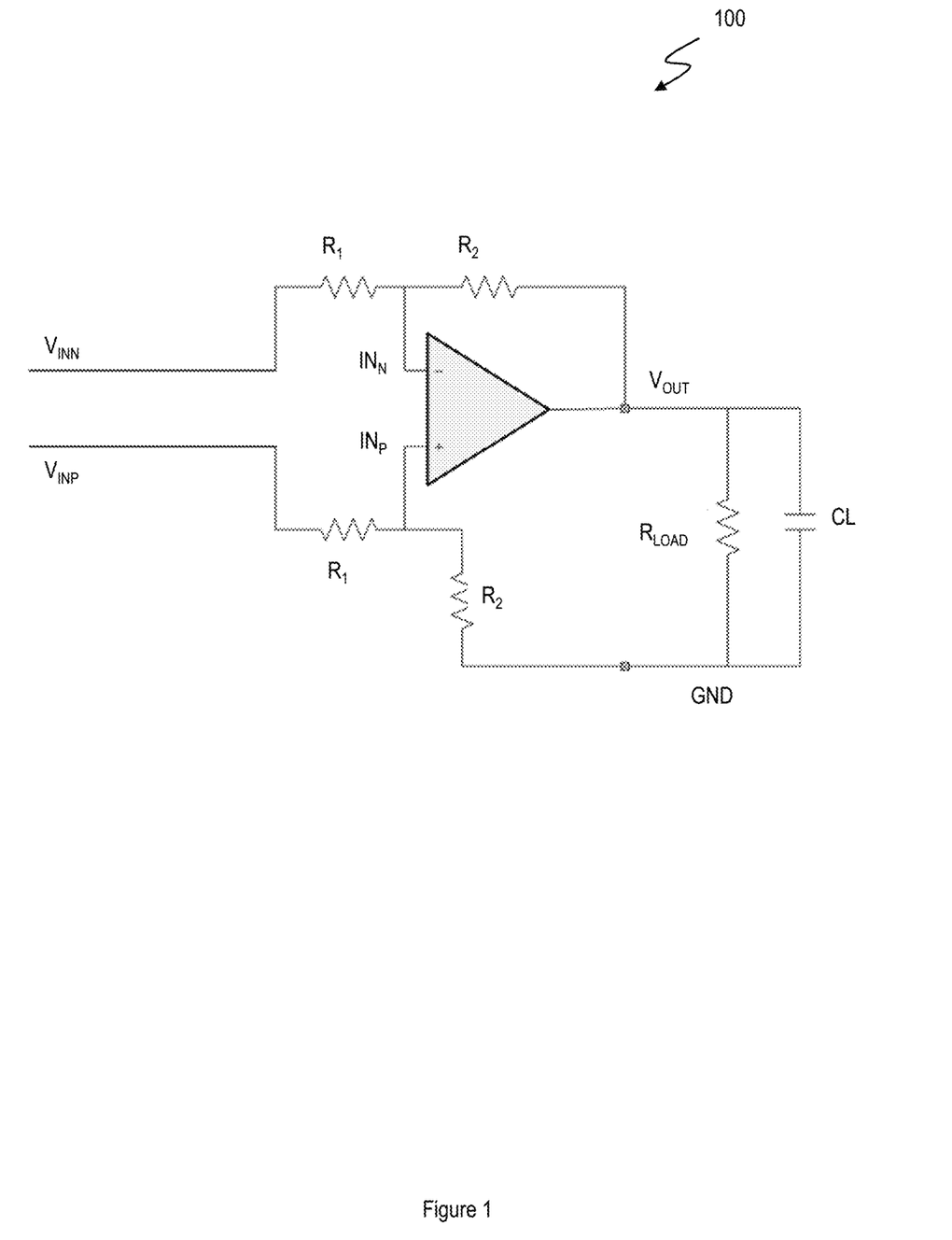
FIG. 1 illustrates one example of an amplifier.

FIG. 1 illustrates an example of a differential-input, single-ended-output amplifier 100. In the example of FIG. 1, differential voltage signals $V_{INN}$ and $V_{INP}$ are supplied to input resistances $R_1$ to provide first and second signals $IN_N$ and $IN_P$, respectively as inputs for the amplifier, although it will be understood that other arrangements are possible. For instance, any of a number of different amplifier topologies could be implemented, such as, for example, nested-miller, Gm-c, Nested Gm-c Compensation (NGCC), Multipath Nested Miller, or transconductance with capacitances feedback compensation (TCFC) arrangements, as would be understood by one skilled in the art. The principles of instability monitoring described herein may be implemented for any such amplifier topology.

Differential amplifier 100 provides output signal $V_{OUT}$ to, in use, drive an audio load, represented by the load resistance $R_{LOAD}$. FIG. 1 also illustrates that the load will have some load capacitance CL.

Amplifier 100 will be designed to be stable for an expected set of operating conditions and for an expected set of load parameters, e.g. load resistance and/or load capacitance. Amplifier 100 may commonly be configured with a high open loop gain and a high bandwidth to provide for low distortion and high PSRR.

As noted above, however, in some operating conditions the amplifier may become unstable. This may especially be the case for headphone amplifier circuits where, in use, a variety of different apparatus may be connected to the amplifier output in various ways, and the load parameters may vary. For example, as the user is in control of the load connected to the output of amplifier 100, a high capacitance load may be connected to amplifier 100.

The amplifier 100 has feedback from the output $V_{OUT}$ to one of the inputs, in this example the input $IN_N$. Thus there is a first signal path between this input and the amplifier output and a feedback path from the amplifier output to form a feedback loop with at least part of the first signal path. As one skilled in the art will understand, for an amplifier with an open-loop gain of $A_{OL}$ and a feedback factor $\beta$, to remain stable, the phase shift of the loop gain should be less than 180 degrees when $|A_{OL}*\beta|>1$.

As will be described in more detail below, amplifier 100 may comprise multiple gain stages. Such an amplifier system will have a certain unity gain bandwidth (UGB), which may, for instance, be defined by the parameters of the input stage and feedback from the output to the input. The system may also exhibit one or more other important poles, e.g. due to other gain stages, and typically such poles may be designed to be relatively far away from the UGB. If a high capacitance load is connected to the output of amplifier 100, this can cause one such pole to move closer to the unity gain bandwidth (UGB) of the amplifier and can cause phase inversion of 180 degrees or more before $A_{OL}$ has crossed the 0 dB point. This results in the amplifier becoming unstable, which as discussed above, can result in various negative effects, such as noise or audio artefacts and/or possibly large inrush currents.

Embodiments of the present disclosure relate to amplifier circuitry and in particular amplifier circuitry capable of monitoring for and detecting amplifier instability.

Figure 2:
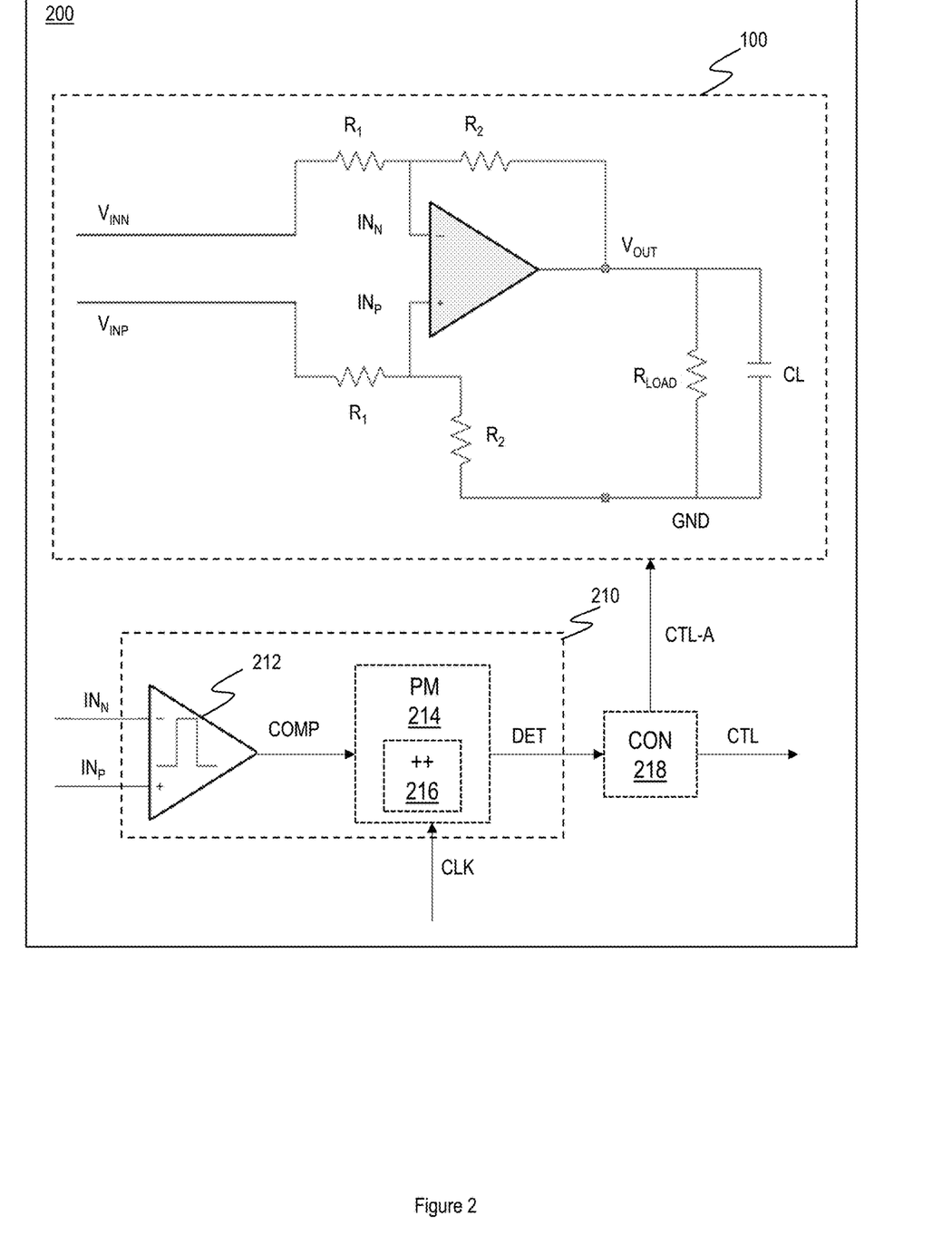
FIG. 2 illustrates one example of circuitry for monitoring for amplifier instability according to an embodiment.

FIG. 2 illustrates one example of amplifier circuitry 200 capable of monitoring for and detecting amplifier instability. Circuitry 200 comprises amplifier 100, which may operate in substantially the same way as discussed in relation to FIG.

1. Again therefore there is a first signal path between an amplifier input ($IN_N$) and an amplifier output ($V_{OUT}$) and a feedback path from the amplifier output to form a feedback loop with at least part of the first signal path. Circuitry 200 further comprises comparison module 210, which comprises comparator 212. Comparator 212 is configured to compare a first signal derived from a first node of amplifier 100 and to compare a second signal derived from a second node of amplifier 100. The first node is a node of the amplifier which is within the feedback loop—and thus exhibit the effects of the instability. The second node is a node of the amplifier which is not with that feedback loop and which can effectively be used as a reference. Preferably the second node is one which varies with the amplifier input signal.

In the illustrated embodiment, comparator 212 may conveniently be configured to compare first differential input signal $IN_N$ and second differential input signal $IN_P$. However, as will be described in more detail below, comparator 212 may compare first and second signals from any suitable nodes of signal paths of amplifier 100. Comparator 212 compares first input signal $IN_N$ and second input signal $IN_P$ to generate comparison signal COMP.

As discussed above, in some operating conditions, for instance if a load with a large capacitance were connected to the output stage of amplifier 100, the amplifier 100 may exhibit instability. If the load capacitance results in a phase inversion between the amplifier output and the input, this can cause the amplifier to oscillate.

The oscillation that results from such amplifier instability will be at a frequency close to the UGB of the amplifier 100. As the UGB is a known factor of the amplifier 100, and is typically significantly higher than the maximum frequency of any signal content for an audio amplifier, this can be exploited to detect when the amplifier 100 has become unstable.

Figure 3:
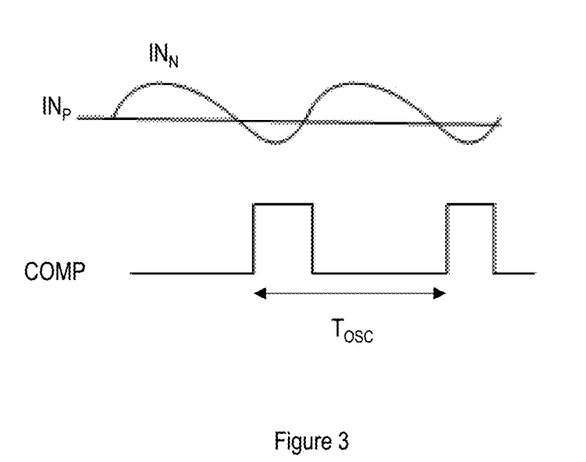
FIG. 3 illustrates an example of waveforms exhibited by the circuitry of FIG. 2 in the event of amplifier instability.

FIG. 3 illustrates waveforms of first input signal $IN_N$, second input signal $IN_P$ and comparison signal COMP during instability of amplifier 100. In the event of amplifier 100 becoming unstable, the amplifier will begin to oscillate, with a frequency at about the UGB. The output of the amplifier will thus include an oscillation signal component at this frequency. As the UGB is a known property of the amplifier 100, oscillation about this frequency will be a characteristic that the amplifier 100 has become unstable. If amplifier 100 becomes unstable and oscillates, the oscillation signal component at the output will be fed-back to the inverting input of amplifier 100 and will modulate the second input signal $IN_N$, as illustrated in FIG. 3.

Second input signal $IN_P$ is supplied as an input to comparator 212 and compared to first input signal $IN_N$. In the amplifier illustrated in FIG. 2, the second input signal $IN_P$ can be seen as a reference to the comparator 212 which sets the input common mode voltage. In normal, stable operation, the first and second input signals track one another. However, if first input signal $IN_N$ begins to oscillate due to amplifier instability, this will cause the first input signal $IN_N$ to vary with respect to second input signal $IN_P$. The first input signal $IN_N$ will oscillate around the value of the second input signal $IN_P$ and the comparison signal COMP from comparator 212, will toggle between its different output states, e.g. high and low, at the crossing points of $IN_N$ relative to $IN_P$. The comparison signal COMP will thus cycle between two states with a frequency $f_{OSC}$ (which is equal to the inverse of the cycle period $T_{OSC}$) that depends on the oscillation frequency of the first input signal $IN_N$.

The oscillation frequency of the comparator output can thus be used as an indication that amplifier 100 has become unstable. In the event of amplifier instability, the amplifier will oscillate at a frequency around the unity gain bandwidth (UGB), which is a known characteristic of an amplifier. A characteristic frequency, indicative of amplifier instability may thus be predetermined for any amplifier, based on the known UGB. The comparison signal COMP can thus be monitored for a characteristic indicative of instability. In some examples the characteristic may be that the comparison signal COMP has a frequency which corresponds to a defined characteristic frequency, e.g. is at characteristic frequency defined with reference to the UGB for the amplifier or within a defined frequency range based on the UGB. In some instances the UGB for the amplifier may be significantly higher than the maximum expected signal content. Thus the characteristic of instability could simply be determination that the comparison signal COMP has a frequency which is above a defined threshold.

Referring again to FIG. 2, in one embodiment circuitry 200 may comprise a processing module 214 configured to receive comparison signal COMP. Processing module 214 may be configured to process comparison signal COMP and to detect when comparison signal COMP comprises the characteristic indicative of instability of amplifier 100. In one embodiment, the characteristic may comprise a characteristic frequency as discussed above.

As noted, during stable operation, the first and second input signals would be expected to track one another and thus the comparison signal would not be expected to toggle significantly. Processing module 214 may therefore be configured to detect a specific characteristic frequency indicative of amplifier instability. In one embodiment, processing module 214 may comprise a digital signal processor (DSP) and/or a state machine and may be configured to determine the frequency of the comparison signal COMP, and, based on the determined frequency, whether the comparison signal COMP exhibits the characteristic of instability.

In some implementations the processing module 214 may determine the period between successive rising or falling edges in the comparison signal COMP, i.e. the cycle period, for instance by counting the number of clock cycles of a clock signal CLK. The processing module 214 may thus comprise a counter 216 that receives the clock signal CLK. In one example, circuitry 200 may comprise a clock generator to generate the clock signal CLK. In another example the clock signal may be supplied from a clock which is generated "off-chip". In some implementations a suitable clock signal may be available for the amplifier circuit for other reasons. The determined cycle period of the comparison signal is a value indicative of the frequency of the comparison signal. The cycle period could be converted to a corresponding frequency, e.g. via suitable look-up table or the like. Alternatively the determined cycle period could be compared to a predetermined periods or range of cycle periods corresponding to a frequency at the UGB of the amplifier.

To reduce the likelihood of any false positive detections of the characteristic frequency, processing module 214 may be configured to detect a signal component corresponding to the characteristic frequency for a predetermined period of time. The predetermined period of time may be dictated by clock signal CLK. In the event of instability, oscillation of the amplifier may be sustained relatively continuously. Noise, or transients due to amplifier operation, could lead to toggling of the comparison signal COMP at what may appear to be the characteristic frequency, but not in a sustained manner. Thus detecting that the signal component at the characteristic frequency persists for the predetermined period of time can distinguish amplifier instability from transients or random noise.

In one example, the processing module 214 may be configured to detect the characteristic frequency for a period that corresponds to a defined minimum of cycles of the characteristic frequency, e.g. the UGB, to determine that amplifier 100 has become unstable. For instance the processing module 214 may be configured to detect the characteristic frequency for a period corresponding to at least 10 cycles. In one example, the UGB of the amplifier may be about 1 MHz. Therefore, processing module 214 may be configured to determine that amplifier 100 is exhibiting instability if the characteristic frequency persists for at least 10 ms—corresponding to the duration of 10 cycles at this frequency. However, the skilled person will appreciate that the predetermined time period may be any suitable length for a given application and may be configurable.

In some implementations, rather than count the number of cycles of a relatively fast clock signal in a cycle period defined by the comparison signal COMP, the counter 216 may instead count the number of cycles of the comparison signal COMP in a count period defined by the clock signal CLK. The count period could correspond to the predetermined period of time, e.g. a period corresponding to a defined number of cycles at the characteristic frequency. If the counter reaches a count value that corresponds to the defined number of cycles during the count period, this can be taken as an indication that the frequency of the comparison signal COMP is at the characteristic frequency.

In some examples, processing module 214 may determine that the amplifier 100 is exhibiting instability based on detecting an oscillation at a frequency which is higher than the maximum signal frequency that amplifier 100 may be expected, in use, to amplify. For example, for at least some audio applications, the maximum signal frequency that amplifier 100 may be expected to drive may be around 96 kHz (based on the maximum common sample rates for digital audio signals). Therefore, if a signal component is present at the output of the amplifier 100 with a frequency which is considerably larger than the maximum signal frequency, it can be determined that this is not due to the signal being amplified, but rather the result of amplifier instability. Therefore, in one example, rather than processing module 214 matching $f_{OSC}$ to being close to a specific characteristic frequency of amplifier 100, e.g. the UGB, processing module 214 may determine whether the oscillation frequency $f_{OSC}$ is above some threshold amount $f_{TH}$, which may be defined with respect to the maximum signal frequency. For instance the frequency threshold $f_{TH}$ may be determined based on the maximum signal frequency $f_{MAX}$ multiplied by a scaling factor k, i.e. the processing module 214 may determine when $f_{OSC} > f_{TH}$ where $f_{TH} = k \cdot f_{MAX}$. In some implementations the scaling factor k may be configurable and in one example may range from 5 to 10. However, the skilled person will understand that the scaling factor k may be set to any suitable value for a given application. Similarly as described above, processing module 214 may be configured to detect amplifier instability in the event that for the oscillation frequency remains above the threshold for a predetermined period of time dictated by the clock signal CLK.

Referring again to FIG. 2, in some examples the amplifier circuitry 200 may further comprise a controller 218. In the event that processing module 214 determines that amplifier 100 is exhibiting instability, processing module 214 may be configured to output a detection signal DET to controller 218. The controller 218 may be operable to respond to the detection signal DET, indicating that the amplifier is unstable, to control one or more aspects of operation of the amplifier. In response to receiving the detection signal DET the controller 218 may thus output a control signal CTL-A to amplifier 100. In one embodiment the control signal CTL-A may control the amplifier 100 to shut-down to avoid continuing instability. In some embodiments, the control signal CTL-A may adjust one or more parameters of the amplifier 100 in order to mitigate for the instability. For example, control signal CTL-A may adjust a value of an internal compensation capacitance of amplifier 100. In another example, control signal CTL-A may additionally or alternatively increase a bias or supply current of the amplifier 100 in order to attempt to stabilise the amplifier. Additionally or alternatively the controller 218 may generate at least control signal CTL to be communicated to some other component which may or may not be integrated with the amplifier circuitry, e.g. the control signal CTL could be transmitted to an Apps processor of a host electronic device to indicate that the amplifier should be shut-down or to communicate an error message to a user of the device, e.g. indicating that the audio load arrangement connected to the electronic device is unsuitable. Note that in some implementation a controller 218 could be integrated with the amplifier circuitry 200, i.e. it could be an on-chip controller, but in some implementation the controller may be an external or off-chip controller, i.e. not integrated with the amplifier circuitry 200.

Figure 4A:
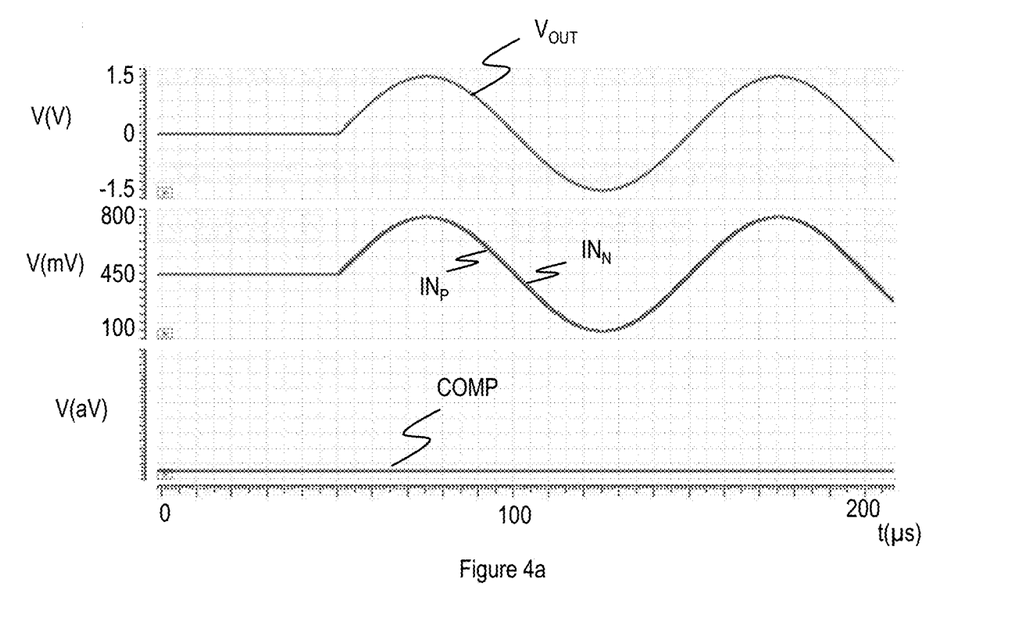
FIGS. 4a-4c illustrate further example waveforms.
Figure 4B:
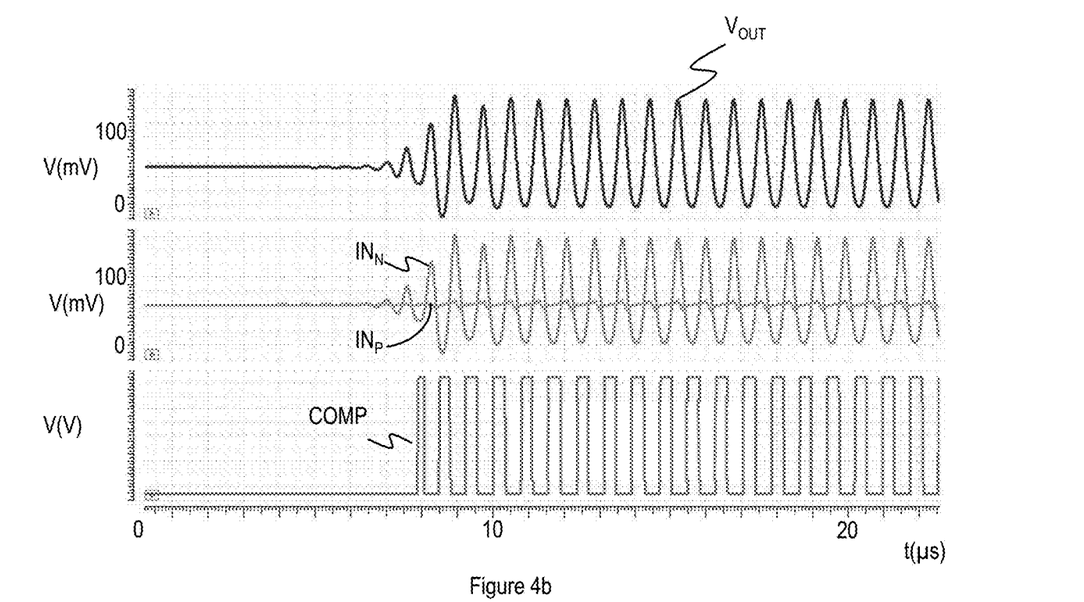
Figure 4C:
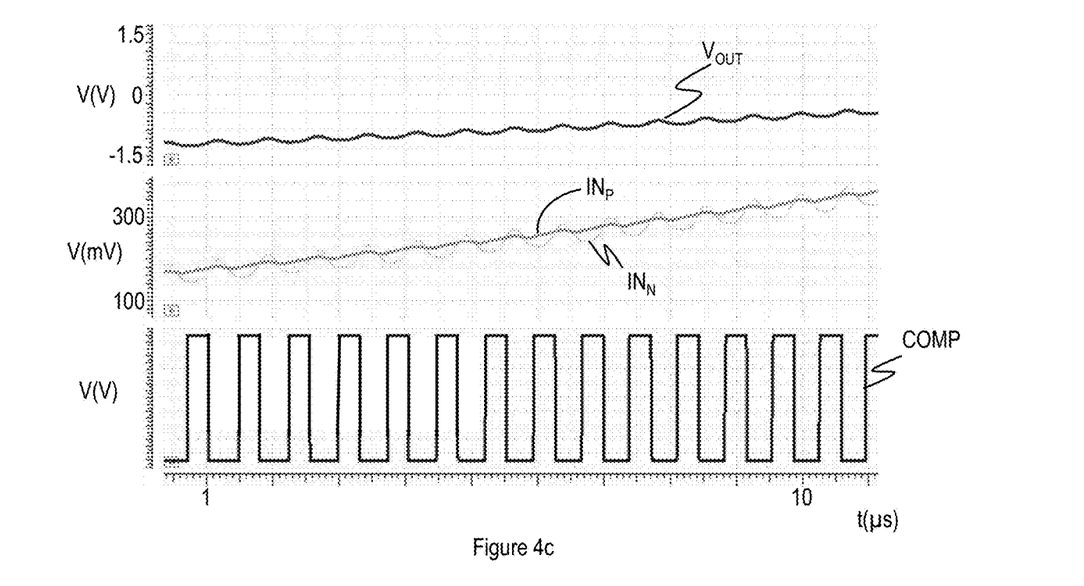

To further explain the principles of the present disclosure, FIGS. 4a-4c illustrate voltage waveforms of output signal $V_{OUT}$, first current signal $IN_N$, second current signal $IN_P$ and comparison signal COMP for different operating conditions of amplifier 100. The example waveforms were obtained from amplifier 100 configured in a transconductance with capacitances feedback compensation (TCFC) architecture. The amplifier 100 was designed to be stable with connected load capacitance of up to 1 nF. The UGB of the amplifier in this example is around 1 MHz.

FIG. 4a illustrates example waveforms of output signal $V_{OUT}$, first input signal $IN_N$, second input signal $IN_P$ and comparison signal COMP during stable operation of amplifier 100 when amplifying an audio signal with some signal content. As amplifier 100 is stable, the output signal $V_{OUT}$ behaves in a consistent manner and the first input signal $IN_N$ tracks second input signal $IN_P$ without any substantial deviation. As such, there are no crossing points between the first and second input signals $IN_N$ and $IN_P$ and therefore comparison signal COMP does not toggle between high and low states. In this case the comparison signal COMP remains in one state, in this example the low state, and thus does not exhibit a characteristic indicative of amplifier instability.

FIG. 4b illustrates example waveforms of output signal $V_{OUT}$, first input signal $IN_N$, second input signal $IN_P$ and comparison signal COMP during a period instability of the amplifier 100. In the illustrated example of FIG. 4b, a load capacitance CL of 10 nF was connected to the output of amplifier 100. The presence of such a high load capacitance leads to amplifier instability. FIG. 4b shows an example with only a quiescent input, i.e. corresponding to no signal content or a period of silence. It can be seen that the output signal $V_{OUT}$ begins to exhibit significant oscillations and these oscillations result in a significant modulation of the first input signal $IN_N$. Therefore, as illustrated in FIG. 4b, first input signal $IN_N$ exhibits significant oscillations at substantially the same frequency as the output signal $V_{OUT}$. As noted above the second input signal $IN_P$ acts like a reference and thus is not significantly affected by the oscillation. The first input signal $IN_N$ thus oscillates about second input signal $IN_P$, as illustrated.

Comparator 212 compares first input signal $IN_N$ and second input signal $IN_P$ and the resulting comparison signal COMP therefore toggles between high and low states as illustrated. As discussed above, the frequency with which comparison signal COMP toggles may be indicative of the amplifier 100 exhibiting instability. In the example of FIG. 4b, the cycle period for oscillation of the comparison signal COMP, e.g. the duration between successive rising (or falling) edges was determined to be about 780 ns, indicating an oscillation frequency of 1.2 MHz. This frequency is significantly higher than a maximum likely signal frequency of say 96 kHz and is around the UGB of the amplifier. Processing module 214 may therefore determine that the amplifier 100 has become unstable based on comparison signal COMP.

FIG. 4c illustrates another example of waveforms of output signal $V_{OUT}$, first input signal $IN_N$, second input signal $IN_P$ and comparison signal COMP during instability of amplifier 100. FIG. 4c also illustrates the behaviour of amplifier 100 with a high capacitance load CL of 10 nF. However, FIG. 4c illustrates the behaviour of the waveforms with an input signal applied to amplifier 100 to be driven, i.e. in the presence of some non-quiescent signal content.

FIG. 4c illustrates the output signal $V_{OUT}$ varying, in this example increasing, in magnitude due to the input signal to be driven. The time period over which FIG. 4c illustrates the waveforms is of the order of about 10 μs and thus corresponds to a relatively short time period in terms of the audio signal.

As amplifier 100 in the example of FIG. 4c is also exhibiting instability, oscillations will be present in $V_{OUT}$, which are fed-back to first current signal $IN_N$. It can be seen that both first input signal $IN_N$ and second input signal $IN_P$ vary due to the audio signal being amplifier, but there is also a high frequency oscillation signal component in the first input signal $IN_N$, which causes the first input signal $IN_N$ to oscillate about second input signal $IN_P$, as illustrated.

Comparator 212 may again compare first and second input signals $IN_N$, $IN_P$ and the resulting comparison signal COMP will toggle between high and low states with a characteristic frequency indicative of amplifier instability. In this example the period between successive rising (or falling) edges in the comparison signal was about 750 ns, indicating a frequency of about 1.3 MHz. Processing module 214 may therefore process comparison signal COMP to determine if the amplifier 100 has become unstable by looking for such a high frequency.

In various embodiments amplifier instability is thus detected by detecting the presence of a high frequency signal component in a signal derived from a signal path of the amplifier. In principle any signal node that would exhibit the oscillating signal component during amplifier instability could be monitored, for instance a monitoring signal could be tapped from the output signal $V_{OUT}$ and frequency analysed, e.g. using an FFT or the like. However, in general it may be preferred to avoid using the output signal for performance reasons and, in at least some implementations, the output driving signal $V_{OUT}$ could be a relatively high voltage signal. Also, implementing a frequency analyser such as an FFT or the like may be relatively complex.

Monitoring the differential input signals, i.e. the first and second input signals $IN_N$ and $IN_P$ is advantageous as these signals track-one another with any audio signal content and this allows the use of a simple comparator to generate the comparison signal which can be used to detect instability. The comparison signal output from the comparator will toggle based on variation of one of the input signals with respect to the other, and thus in the event of any oscillation due to instability the comparison signal will exhibit a frequency that corresponds to the oscillation frequency.

As mentioned, the frequency of the comparison signal can be readily determined, for instance by determining the time between successive rising or falling edges in the comparison signal, e.g. by counting the number of clock cycles of a suitable clock signal. The cycle period, and hence frequency, of the comparison signal can thus be readily determined. A comparator and counter can be implemented as low power and low area circuitry and thus do not add significantly to the power or area of the amplifier circuitry.

Whilst the use of the input signals $IN_N$ and $IN_P$ may be convenient, other signal nodes of the amplifier could be monitored and two signals from any suitable signal paths of amplifier 100 may be used as inputs to comparator 212 to monitor for amplifier instability.

Figure 5:
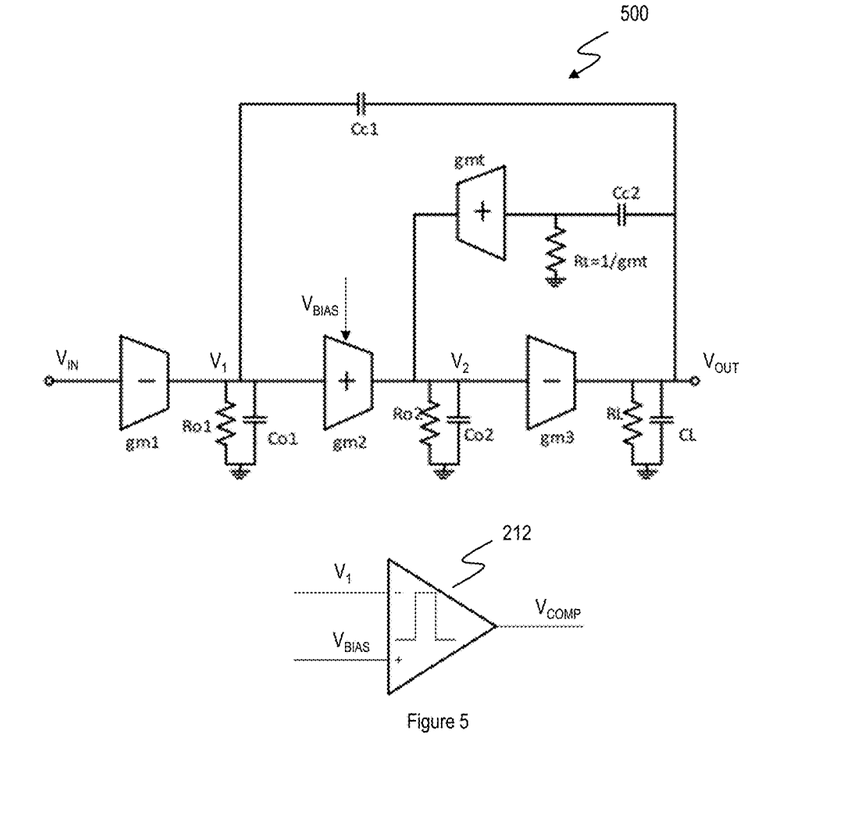
FIG. 5 illustrates another example of circuitry for monitoring for amplifier instability according to an embodiment.

To illustrate, FIG. 5 illustrates schematically an amplifier 500 configured in a transconductance with capacitances feedback compensation (TCFC) architecture, which could be used for the amplifier 100 discussed above. Amplifier 500 in the example of FIG. 5 comprises a series of three gain stages gm1, gm2 and gm3. However, the skilled person will appreciate that amplifier 500 may comprise any suitable number of gain stages.

Input signal $V_{IN}$ is sequentially driven by first gain stage gm1, second gain stage gm2 and third gain stage gm3 of amplifier 500 to output an output signal $V_{OUT}$. A feedback path comprising a first miller capacitor Cc1 is provided between the amplifier output and the output of the first stage gm1. Amplifier 500 also comprises a transconductance gain stage gmt, which is in series with a second miller capacitor Cc2, in this case in a feedback path around the final gain stage gm3.

In this example the second stage gm2 may additionally or alternatively be monitored to detect amplifier instability. In particular the output V1 of the first gain stage that is an input to the second gain stage may be monitored. If oscillations are present in the output signal $V_{OUT}$, these oscillations will therefore be fed-back to the input node of second gain stage gm2 and be present in this voltage $V_1$. First gain stage output voltage $V_1$ may therefore be supplied as an input to comparator 212, as an alternative to first current signal INN.

The second input to comparator 212 is a suitable reference signal that first gain stage output voltage $V_1$ oscillates around in the event of amplifier instability. In this example second gain stage gm2 receives a bias voltage $V_{BIAS}$ for biasing the second gain stage gm2. This bias voltage $V_{BIAS}$ may be supplied as the second input to comparator 212 to compare to first gain stage output voltage $V_1$.

As one skilled in the art will understand, in a TCFC amplifier, the voltage V1 output from the first stage and the bias voltage $V_{BIAS}$ will track one another in normal operation, i.e. V1 and $V_{BIAS}$ track one another in the presence of any audio signal content. Thus, in a similar manner as the signals $IN_N$ and $IN_P$ discussed above, if the amplifier oscillates the voltage V1 will oscillate around $V_{BIAS}$, i.e. $V_{BIAS}$ will act like a common-mode voltage for the oscillations of V1. One skilled in the art will be well aware of how a suitable bias voltage $V_{BIAS}$ may be generated, for instance using a bandgap voltage as a reference, or using a resistor divider or current into a diode for example.

Figure 6:
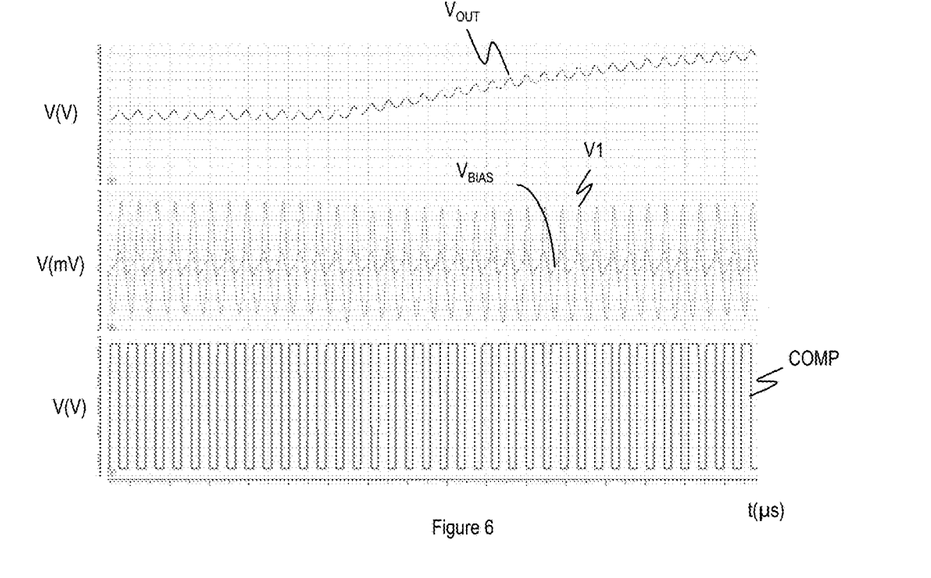
FIG. 6 illustrates an example of waveforms exhibited by the circuitry of FIG. 5 in the event of amplifier instability.

FIG. 6 illustrates example waveforms of output signal $V_{OUT}$, first gain stage output voltage $V_1$, bias voltage $V_{BIAS}$ and comparison signal COMP during instability of amplifier 500. Due to the instability, the output signal $V_{OUT}$ oscillates, as illustrated in FIG. 6. FIG. 6 illustrates a period where initially the audio signal content is at a quiescent level, and thus the output signal $V_{OUT}$ oscillates about an output quiescent level, and then the audio signal content causes the overall magnitude of the output signal to increase.

The oscillations of the output signal $V_{OUT}$ will be fedback to the input to second gain stage gm2 and will modulate the output voltage $V_1$ as discussed above. Therefore, first gain stage output voltage $V_1$ also exhibits oscillations during amplifier instability, which result in this voltage $V_1$ also oscillating about the bias voltage $V_{BIAS}$.

The resulting comparison signal COMP will thus likewise toggle between high and low states with a frequency corresponding to the characteristic frequency of amplifier instability in a similar manner as discussed previously. Comparison signal COMP may be supplied to processing module 214, which processes comparison signal COMP to detect and signal amplifier instability.

The description in relation to FIG. 5 and FIG. 6 has shown that signal paths of the second gain stage gm2 may be monitored to detect amplifier instability. However, the skilled person will appreciate that any two suitable signal paths of an amplifier may be monitored to detect amplifier instability, in accordance with the present disclosure.

As noted above the principles described herein can thus be used to monitor for and detect amplifier instability in a range of different amplifiers. Such monitoring may be particularly useful for audio driving circuits that may, in use, be removably connected to a range of different loads, e.g. headphone amplifier circuits and the like. However amplifier instability monitoring circuitry such as described in any of the variants herein could usefully be employed in other applications, which may or may not be audio applications and embodiments related to amplifiers that may be used for any purpose.

Embodiments may be implemented as an integrated circuit which in some examples could be a codec or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a wearable device such as a smartwatch. The device could be a device with voice control or activation functionality.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for detecting audio amplifier instability, comprising:
   an audio amplifier; and
   a processing module configured to receive a first signal from the audio amplifier and to process the first signal to detect an oscillation frequency indicative of the instability of the audio amplifier;
   wherein the oscillation frequency comprises a frequency within a defined frequency range;
   wherein the oscillation frequency comprises a frequency that exceeds a defined threshold; and
   wherein the defined threshold is based on a value of maximum input signal frequency and a scaling factor.

2. Circuitry according to claim 1 wherein said defined frequency range includes a frequency corresponding to a unity gain bandwidth of the audio amplifier.

3. Circuitry according to claim 1 wherein the processing module is configured so that at least one of the value of maximum input signal frequency and the scaling factor are configurable.

4. Circuitry according to claim 1 wherein the processing module is configured to determine that the first signal comprises the oscillation frequency indicative of audio amplifier instability if the oscillation frequency persists for a predetermined time period.

5. Circuitry according to claim 4 wherein the predetermined time period is configurable.

6. Circuitry according to claim 1 further comprising a controller, wherein in response to the processing module detecting the oscillation frequency indicative of audio amplifier instability, the processing module is configured to output a detection signal to the controller.

7. Circuitry according to claim 6 wherein in response to receiving the detection signal, the controller is configured to output a control signal to control the audio amplifier to shut-down.

8. Circuitry according to claim 6 wherein in response to receiving the detection signal the controller is configured to output a control signal to adjust at least one parameter of operation of the audio amplifier.

9. Circuitry according to claim 1 wherein the audio amplifier comprises an input gain stage and one or more subsequent gain stages and the first signal is received from a node of one of said subsequent gain stages.

10. Circuitry according to claim 1 wherein the first signal comprises an output signal of the audio amplifier.

11. Circuitry according to claim 10 wherein the processing module comprises a frequency analyser configured to analyse the output signal to detect the oscillation frequency indicative of the instability of the audio amplifier.

12. An electronic device comprising circuitry according to claim 1 and a connector for making a removable mating connection with an accessory apparatus in use, wherein said circuitry is configured to output at least one audio driving signal to an electrical contact of said connector.

13. Circuitry for detecting audio amplifier instability, comprising:
   an audio amplifier; and
   a processing module configured to receive a first signal from the audio amplifier and to process the first signal to detect an oscillation frequency indicative of the instability of the audio amplifier;
   wherein the oscillation frequency comprises a frequency within a defined frequency range;
   wherein the oscillation frequency comprises a frequency that exceeds a defined threshold;
   wherein the defined threshold is based on a value of maximum input signal frequency and a scaling factor; and
   wherein the processing module comprises a counter configured to receive a clock signal, and the processing module is configured to determine a cycle period of the first signal as a value indicative of the frequency of the first signal.

14. Circuitry for detecting audio amplifier instability, comprising:
   an audio amplifier; and
   a processing module configured to receive a first signal from the audio amplifier and to process the first signal to detect an oscillation frequency indicative of the instability of the audio amplifier;
   wherein the oscillation frequency comprises a frequency within a defined frequency range;
   wherein the oscillation frequency comprises a frequency that exceeds a defined threshold;
   wherein the defined threshold is based on a value of maximum input signal frequency and a scaling factor; and
   wherein the processing module comprises a counter configured to receive a clock signal, and the processing module is configured to determine a count value of a number of cycles of the first signal in a count period defined by the clock signal.

* * * * *